United States Patent [19]

Yamada

[11] Patent Number: 4,602,228

[45] Date of Patent: Jul. 22, 1986

[54] SURFACE ACOUSTIC WAVE FILTER

[75] Inventor: Jun Yamada, Yokohama, Japan

[73] Assignee: Hitachi, Ltd., Tokyo, Japan

[21] Appl. No.: 672,205

[22] Filed: Nov. 16, 1984

[30] Foreign Application Priority Data

Nov. 30, 1983 [JP] Japan ................................. 58-224188

[51] Int. Cl.$^4$ ............................................. H03H 9/64
[52] U.S. Cl. .................. 333/194; 310/313 D;
333/154; 333/196
[58] Field of Search .................. 333/150–155,
333/193–196; 310/313 A, 313 B, 313 C, 313 D,
313 R; 455/307; 358/21 R, 36, 38, 40

[56] References Cited

U.S. PATENT DOCUMENTS

| 3,686,518 | 8/1972 | Hartmann et al. | 310/313 B |
| 3,723,919 | 3/1973 | Adler | 310/313 B |
| 3,866,154 | 2/1975 | Moore | 333/154 |
| 4,422,000 | 12/1983 | Yamada et al. | 310/313 D |

OTHER PUBLICATIONS

Yamada et al—"Relation of the Insertion Loss and Triple Transit Echo in Saw Unidirectional Transducers", Proc. of 3rd Symposium of Ultrasonic Electronics, Tokyo, 1982, JJAP, vol. 22 (1983) Supplement 22-3; pp. 163–164.

Yamanouchi et al—"Low Insertion Loss Acoustic Surface Wave Filter Using Group-Type Unidirectional Interdigital Transducer", 1975 Ultrasonics Symposium Proceedings; pp. 317–321.

*Primary Examiner*—Marvin L. Nussbaum
*Attorney, Agent, or Firm*—Antonelli, Terry & Wands

[57] ABSTRACT

A surface acoustic wave filter comprising unidirectional interdigital input and output transducers at least one of which has imperfect unidirectivity and includes two interdigital electrodes arranged to provide a geometrical phase difference $\phi_M$ therebetween and interconnected through a phase shifter which provides an electrical phase difference $\phi_E$ therebetween, the sum of the phase differences $\phi_M$ and $\phi_E$ being unequal to $\pi$ radians to provide the imperfectness of unidirectivity. The selection range of conductance of an external load or radiation conductance of the unidirectional transducer necessary for suppressing the undesired triple transit echo level can thus be extended while keeping the insertion loss relatively low.

5 Claims, 5 Drawing Figures

SURFACE ACOUSTIC WAVE FILTER

BACKGROUND OF THE INVENTION

This invention relates to a unidirectional surface acoustic wave filter and more particularly to a surface acoustic wave filter which can increase the degree of freedom of design with simultaneous attainment of reduction in size.

A unidirectional transducer has hitherto been proposed with a view of reducing insertion loss in a surface acoustic wave filter, as disclosed in, for example, "Low Insertion Loss Acoustic Surface Wave Filter Using Group-type Unidirectional Interdigital Transducer" by Kazuhiko Yamanouchi et al. at Research Institute of Electrical Communication, Tohoku University, Japan, IEEE 1975 Ultrasonics Symposium Proceedings, IEEE (at #75 CHO 994-4SU pp. 317-321, and U.S. Pat. No. 4,422,000 to Jun Yamada and Katashi Hazama entitled "Unidirectional Surface Acoustic Wave Device with Meandering Electrode", patented on Dec. 20, 1983 and assigned to Hitachi, Ltd.

Because of its bidirectionality, an ordinary surface acoustic wave transducer inherently has an insertion loss of 6 dB, even estimated in minimum, whereas a surface acoustic wave transducer having perfect unidirectivity has a loss which is ideally zero.

To explain the operational principle of the unidirectional transducer, reference is now made to FIG. 1 which illustrates a simplified model of an interdigital input transducer and its peripheral circuit. Although not shown, an interdigital output transducer has a similar construction where a load substitutes for a signal source 3 shown in FIG. 1. In FIG. 1, an interdigital sending electrode 5 and an interdigital reflection electrode 6 constitute the interdigital input transducer. The interdigital sending electrode 5 is connected to the signal source 3 through a phase shifter 2 which provides an electrical phase difference of $\pi/2$ radians. Reference numeral 4 denotes a drive conductance of signal source 3 which is $G_I$. The interdigital reflection electrode 6 is connected directly to the signal source 3. The distance between the interdigital sending electrode 5 and interdigital reflection electrode 6 is chosen so as to correspond to a geometrical phase difference of $\pi/2$ radians therebetween. A forward propagation direction and a backward propagation direction are designated by reference numerals 7 and 8, respectively.

In operation, speaking of the forward direction side, surface acoustic waves $W_{SF}$ and $W_{RF}$ respectively propagating from the interdigital sending and reflection electrodes 5 and 6 in the forward direction 7 are both delayed, electrically or geometrically, by $\pi/2$ radians with respect to the phase of a signal of the signal source 3 and consequently in phase with each other at a position of the interdigital sending electrode 5, with the result that a surface acoustic wave propagating from the interdigital input transducer in the forward direction amounts to the sum of $W_{SF}$ and $W_{RF}$. On the backward direction side, a surface acoustic wave $W_{RR}$ propagating from the interdigital reflection electrode 6 in the backward direction 8 is in phase with the signal of the signal source 3 but a surface acoustic wave $W_{SR}$ propagating from the interdigital sending electrode 5 in the backward direction 8 is delayed in phase by $\pi$ radians with respect to the signal of the signal source 3 at a position of the interdigital reflection electrode 6, with the result that the waves $W_{RR}$ and $W_{SR}$ are out of phase with each other and cancelled out to nullify a resultant surface acoustic wave propagating in the backward direction 8, thereby attaining the unidirectivity.

To add, since, in the case of the ordinary bidirectional transducer, surface acoustic waves uniformly propagate in the forward and backward directions with respect to the electrode structure or the transducer, there exists an insertion loss of 3 dB, and consequently, taking both the input and output transducers into consideration, there necessarily exists an insertion loss of at least 6 dB as a whole.

In the case of the unidirectional transducer of FIG. 1, both the electrical and geometrical phase differences are set to be $\pi/2$ radians so as to provide perfect unidirectivity. However, it should be noted that the perfect unidirectivity can be obtained even when the sum of an electrical phase difference due to the phase shifter and a geometrical phase difference between the interdigital sending and reflection electrodes is $\pi$ radians, as will be known from the disclosure of the aforementioned U.S. Pat. No. 4,422,000.

FIG. 2 shows the construction of a typical prior art unidirectional transducer. In FIG. 2, identical members to those of FIG. 1 are designated by identical reference numerals and will not be detailed. There are seen in FIG. 2, a unidirectional transducer 1, the $\pi/2$ phase shifter 2, the signal source 3, the drive conductance 4 of the signal source 3 which is $G_I$, interdigital sending electrodes 5', and interdigital reflection electrodes 6'. Forward and backward directions of propagation of surface acoustic waves are designated by the reference numerals 7 and 8, respectively. The distance between the interdigital sending and reflection electrodes 5' and 6' is set such that the geometrical phase difference therebetween is $\pi/2$ radians.

With this prior art transducer, unless an input conductance of Ga of the unidirectional transducer (inclusive of a conductance of the $\pi/2$ phase shifter) as viewed from the signal source side substantially equals the drive conductance $G_I$ of the signal source, it is impossible to suppress undesired transducer reflection and to keep an insertion loss low. Therefore, restrictions are imposed on size and shape of the unidirectional transducer and the value of the drive conductance, resulting in such inconvenience as impairment of the degree of freedom of design. More particularly, when making an attempt to substantially match the input conductance of the transducer with a large drive conductance of the signal source, the transducer aperture length W shown in FIG. 2, must be increased and consequently, the device chip is increased in size to raise manufacture cost. Also, when the unidirectional transducer is employed in mass-production products such as, for example, intermediate frequency filters in color television receiver sets, the following problems arise. That is, a signal source conductance (for example, an output conductance of a tuner) and the input conductance of the unidirectional transducer vary about respective predetermined center values due to the variations in such as values of parts constituting the $\pi/2$ phase shifter, manufacture processes of the tuner and the $\pi/2$ phase shifter, and the like. Accordingly, to adjust the conductance of signal source or the input conductance of unidirectional transducer, it is necessary either to insert a variable conductance element in the signal source line or to effect adjustment of circuit constants of the phase shifter or trimming of the transducer. Such inconveniences also occur in the load conductance and the output conductance of the unidirectional transducer and therefore, any of the adjustments described above are required.

SUMMARY OF THE INVENTION

An object of this invention is to provide an improved, adjustment-free and small-sized surface acoustic wave filter which can eliminate the disadvantages of the prior art surface acoustic wave filter.

Another object of this invention is to provide a surface acoustic wave filter which can extend the selection range of radiation conductance of the unidirectional transducer or of external load conductance.

According to one aspect of the invention, at least one of interdigital input and output transducers comprises two interdigital electrodes arranged to provide a geometrical phase difference of $\phi_M$ radians therebetween, and a phase shifter connected between the electrodes, for providing an electrical phase difference of $\phi_E$ radians, the sum $(\phi_M + \phi_E)$ of the phase differences being unequal to $\pi$ radians. Namely, the present invention intentionally disuses a transducer of perfect unidirectivity.

According to another aspect of the invention, when the degree of the unidirectivity a of the unidirectional transducer as defined by $$a = \frac{1 + \cos(\phi_M + \phi_E)}{1 + \cos(\phi_M - \phi_E)}$$

falls within a range $0 < a \leq 9/11$, the ratio between radiation conductance $G_a$ of the interdigital transducer and signal source or load conductance $G_l$ is chosen so as to satisfy $$\frac{9(a+1)}{11-9a} \leq G_l/G_a \leq \frac{11(a+1)}{9-11a}$$

and when the degree a defined as above falls within a range $9/11 \leq a \leq 1$, the ratio between $G_a$ and $G_l$ is chosen so as to satisfy $$\frac{9(a+1)}{11-9a} \leq G_l/G_a$$

In an application of the surface acoustic wave filter to the intermediate frequency filter of television receiver sets, the undesired reflection wave or the triple transit echo (TTE) is required to be suppressed to less than $-40$ dB which is the threshold level of ghost detection. When the above conditions are satisfied, this requirement can be met while attaining reduction of the filter size without causing the excessive increase in insertion loss and while eliminating the troublesome adjustment required to make the prior art interdigital unidirectional transducer operate under the condition of the perfect unidirectivity.

DESCRIPTION OF THE PREFERRED EMBODIMENTS

Before describing an embodiment of the present invention, the prior art unidirectional transducer will be further detailed.

When considering that the transducer is a three pair ported network, the relation between loss and interelectrode triple transit echo in the unidirectional transducer can be expressed by transmission and reflection components of a scattering matrix as well known in the art. In this connection, reference may be made to "Relation of the Insertion Loss and the Triple Transit Echo in SAW Unidirectional Transducers" by Jun Yamada and Katashi Hazama, Proceedings of 3rd Symposium on Ultrasonics Electronics, Tokyo 1982, Japan, Japanese Journal of Applied Physics, Vol. 22 (published July, 1983) Supplement 22-3, pp. 163–164.

Figure 3:
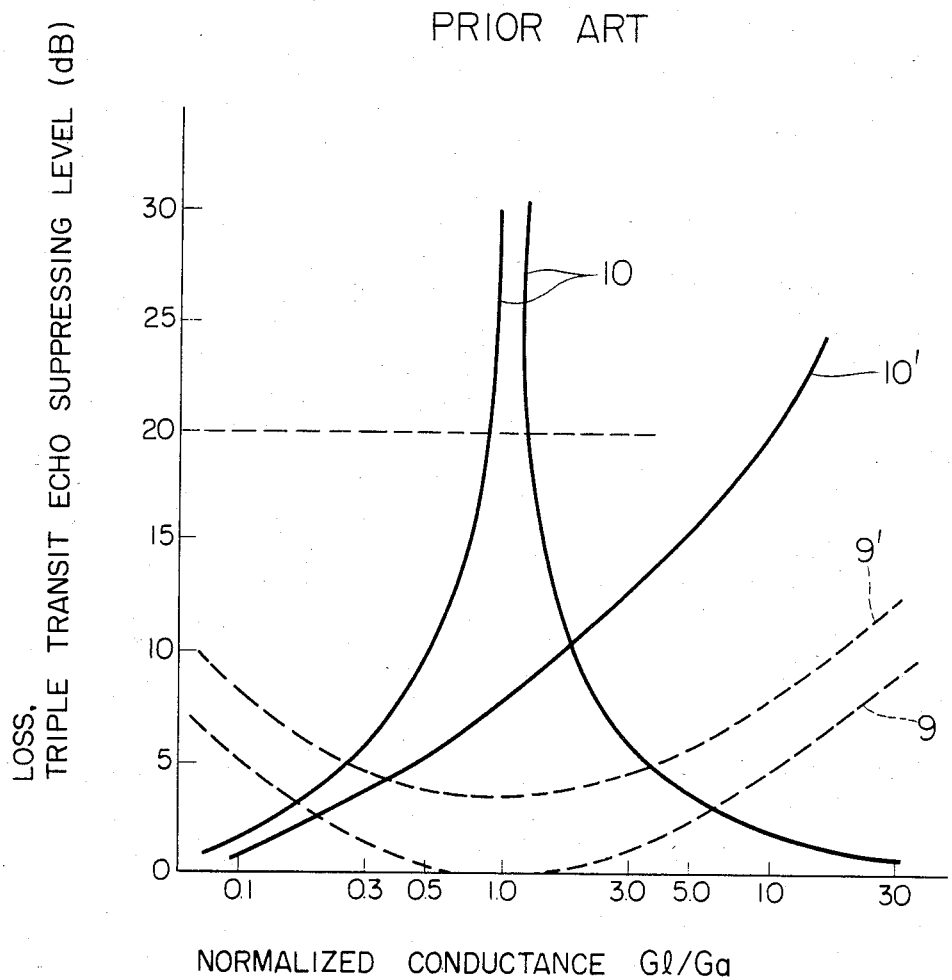
FIG. 3 graphically shows characteristics representative of effect of normalized conductance upon loss and triple transit echo suppressing level in the prior art unidirectional transducer and bidirectional transducer.

FIG. 3 shows characteristics of the prior art unidirectional transducer (and bidirectional transducer) analyzed by the authors of the above article. In FIG. 3, loss and triple transit echo suppressing level in the unidirectional transducer are represented by curves 9 and 10, respectively. The characteristics shown in FIG. 3 result from theoretical calculation on one unidirectional transducer. If the input and output transducers are both of the unidirectional type, the loss on ordinate will be doubled in decibel representation. Abscissa represents normalized conductance b defined by the ratio of drive conductance $G_l$ of the signal source to radiation conductance $G_a$ of the transducer.

From the requirement of the threshold level of ghost detection, it is generally accepted that the triple transit echo should preferably be suppressed to $-40$ dB or less in relation to the main signal. The "threshold of ghost detection" means a critical ghost in color television pictures which is visible to human eyes, and the intensity of the ghost depends on the magnitude of the triple transit echo generated by the intermediate frequency band-pass filter of color television receiver sets.

When the unidirectional transducer is used for each of the input and output transducers, the triple transit echo suppressing level should be at least 20 dB for each of them. From FIG. 3, a normalized conductance b which satisfies this requirement falls within a range $9/11 \leq b \leq 11/9$.

To bring the value of b into this range, the troublesome adjustment is required for conductance values on the signal source side and on the transducer side, as described previously.

Curves 9' and 10' in FIG. 3 represent the loss and triple transit echo suppressing level in the prior art bidirectional transducer analyzed by the authors of the aforementioned article. However, it should be noted that the bidirectional transducer analyzed herein is a prior art bidirectional transducer having a single interdigital transducer which is quite different from an imperfect unidirectional transducer of the present invention which has input and/or output transducers comprising sending and reflection electrodes and which is made imperfect in unidirectivity.

As will be appreciated from the foregoing description, in the known unidirectional transducer, perfect unidirectivity has been sought, and a unidirectional transducer having imperfect unidirectivity was first invented and commercially practiced by the present inventors to solve such various problems inherent to the known unidirectional transducer of perfect unidirectivity as described previously.

In contrast to the prior art unidirectional transducer, a transducer according to the present invention is featured by imperfectness of unidirectivity wherein unidirectivity of the transducer is made imperfect at the cost of slight degradation in loss characteristic so as to extend the range of b to thereby eliminate the necessity of adjustment required in the prior art transducer.

Figure 1:
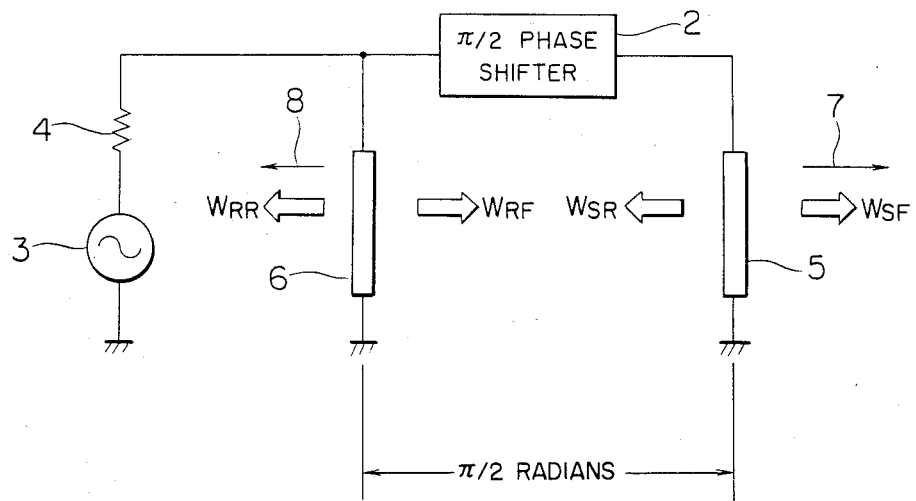
FIG. 1 is a schematic diagram useful in explaining the operational principle of a unidirectional transducer.
Figure 2:
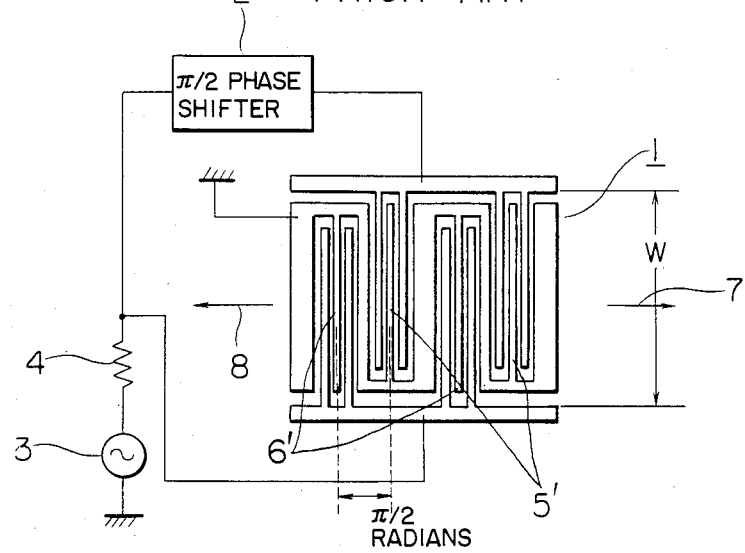
FIG. 2 is a circuit diagram of a prior art unidirectional transducer.
Figure 4:
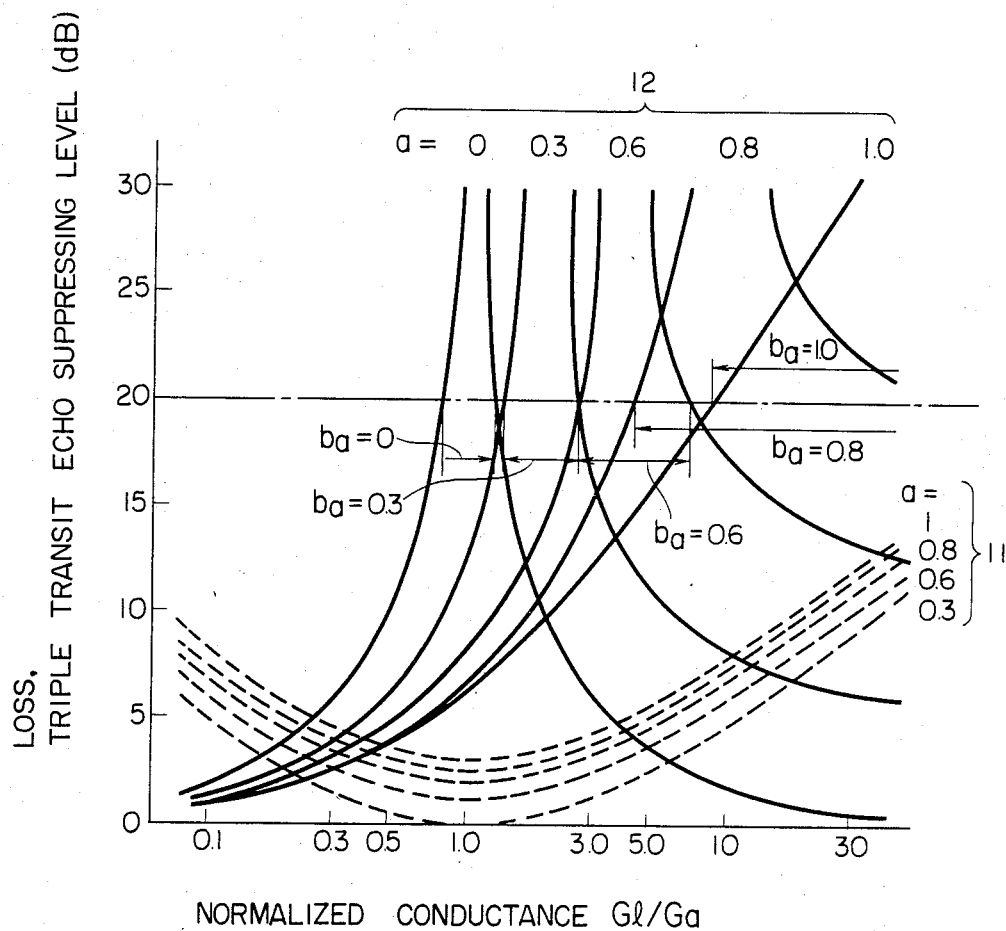
FIG. 4 graphically shows characteristics representative of effect of normalized conductance upon loss and triple transit echo suppressing level in a unidirectional transducer according to the invention.
Figure 5:
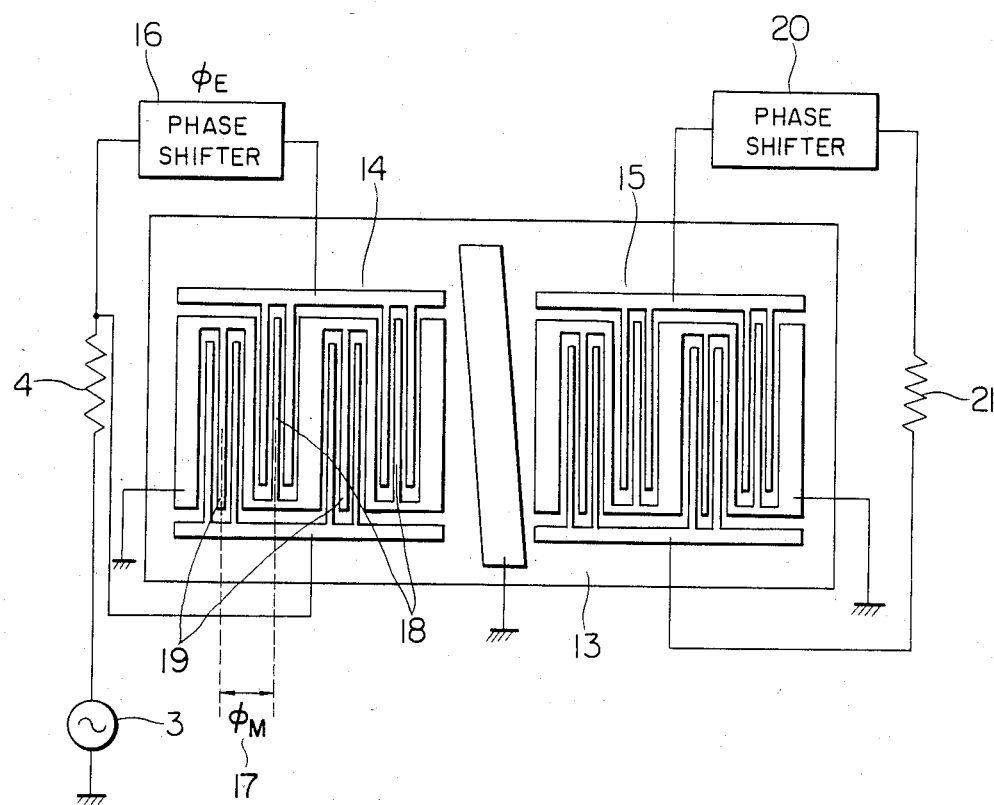
FIG. 5 is a circuit diagram of a filter according to an embodiment of the invention.

Referring now to FIGS. 4 and 5, the invention will be described in greater detail. In FIGS. 4 and 5, identical parts to those of FIGS. 1 to 3 are designated by identical reference numerals and will not be described.

In the first place, the imperfect unidirectivity can be obtained by selecting the geometrical phase difference $\phi_M$ between the interdigital sending and reflection electrodes and the electrical phase difference $\phi_E$ due to the phase shifter such that the sum thereof does not equal $\pi$ radians.

In the second place, by using as a parameter the degree a of directivity defined by the ratio of surface acoustic wave power propagating in the forward direction to that propagating in the backward direction, loss $L_{31}$ and triple transit echo suppressing level $L_{11}$ are determined in a similar manner to the aforementioned article so as to be indicated by the following equations:

$$L_{31} = -10 \log \left\{ \frac{4b}{(1 + a)(1 + b)^2} \right\} \text{ (dB)}$$

$$L_{11} = -10 \log \left\{ \frac{(a - r)^2}{(a + 1)^2} \right\} \text{ (dB)}$$

where r is $$\left| \frac{b - 1}{b + 1} \right|$$

This result is graphically illustrated in FIG. 4 where dotted curves 11 represent the loss and solid curves 12 represent the triple transit echo suppressing level. By using the geometrical phase difference $\phi_M$ radians due to the positional difference between the interdigital sending and reflection electrodes and the electrical phase difference $\phi_E$ radians due to the phase shifter, the scale a of directivity can be expressed as $$a = \frac{1 + \cos(\phi_M + \phi_E)}{1 + \cos(\phi_M - \phi_E)}$$

because under the application of unit voltage to both the interdigital sending and reflection electrodes, surface wave distortions excited in the forward and backward directions are $e^{-j\phi_E} + e^{-j\phi_M}$ and $e^{-j\phi_E} + e^{j\phi_M}$, respectively, and hence power radiations in the forward and backward directions are $2\{1 + \cos(\phi_M - \phi_E)\}$ and $2\{1 + \cos(\phi_M + \phi_E)\}$, respectively.

In a prior art example where $\phi_M = \phi_E = 0$, $a = 1$ is obtained, indicating a bidirectional transducer in which power radiations take place in the forward and backward directions. In an example where $\phi_M = \phi_E = \pi/2$ radians, $a = 0$ is obtained, indicating a unidirectional transducer of perfect unidirectivity.

At a limiting value of b becoming infinity ($b \to \infty$), the triple transit echo suppressing level $L_{11}$ is given by (not in decibel representation)

$$L_{11} = \left( \frac{1 - a}{1 + a} \right)^2$$

When determining a range of b within which $L_{11} \leq 1/A^2$ (where $A \geq 1$) stands by using the above limiting value, $L_{11} = 1/A^2$ has only one solution when a exceeds $(A - 1)/(A + 1)$ and as a result, b lies in a semi-infinite region. But, for a value of a being less than $(A - 1)/(A + 1)$, $L_{11} = 1/A^2$ has two solutions and a finite region of b can be determined. Here, A is determined by a value dependent on the threshold level of ghost detection as will be described later. The above results can be calculated through a calculation process wherein a region of r is first obtained from $(a - r)^2/(a + 1)^2 \leq 1/A^2$, providing $$\frac{aA - a - 1}{A} \leq r \leq \frac{aA + a + 1}{A},$$

and a region of b is then calculated from $b = (1 + r)/(1 - r)$ providing the following results:

(a) For $0 \leq a \leq (A - 1)/(A + 1)$
There results $$\frac{A + (aA - a - 1)}{A - (aA - a - 1)} \leq b \leq \frac{A + (aA + a + 1)}{A - (aA + a + 1)}.$$

(b) For $(A - 1)/(A + 1) \leq a \leq 1$
There results $$\frac{A + (aA - a - 1)}{A - (aA - a - 1)} \leq b.$$

Now, from the requirement of the threshold level of ghost detection, $L_{11} \leq 20$ dB i.e. $A = 10$ sould be satisfied for either one of the interdigital input or output transduces. Therefore, the results in items (a) and (b) as above are reduced to the following:

(a) For $0 \leq a \leq 9/11$, $$\frac{9(a + 1)}{11 - 9a} \leq b \leq \frac{11(a + 1)}{9 - 11a}$$

and
(b) For $9/11 \leq a \leq 1$, $$\frac{9(a + 1)}{11 - 9a} \leq b.$$

As will be seen from FIG. 4, as the degree of directivity increases through $0 \to 0.3 \to 0.6 \to 0.8 \to 1.0$, the region of b satisfyiung the predetermined triple transit echo suppressing level (20 dB herein) is shifted from $b_{a=0} \to b_{a=0.3} \to b_{a=0.6} \to b_{a=0.8} \to b_{a=1.0}$, so that the value of b is larger than that for the perfect unidirectivity ($a = 0$).

Thus, the arrangement of the interdigital electrodes and the phase shifter are so set as to provide the predetermined phase differences in such a manner that the imperfectness of unidirectivity can be obtained, thereby extending the selection range of the external load conductance or the radiation conductance of the transducer necessary for suppressing the undesired triple transit echo to a desired level.

Consequently, the necessity of the impedance adjustment in the prior art device can be eliminated.

Since the region of the normalized conductance shifts to a region of larger values as compared to the prior art values, the radiation conductance of the transducer can be reduced and consequently, the filter per se can advantageously be reduced in size.

Although the loss represented by $L_{31}$ is increased, an increase in loss is not generally so great as to disallow practical use of the device.

FIG. 5 shows a filter according to an embodiment of the invention. As a piezoelectric substrate 13, a 128° rotated Y-axis cut lithium niobate single crystalline substrate is used with X-axis directed to the propagation direction of the surface acoustic wave. An interdigital input transducer 14 and an interdigital output transducer 15 have each a group-type unidirectional transducer structure including 4-pair 2 groups. The interdigital input transducer 14 comprises interdigital sending electrodes 18 and interdigital reflection electrodes 19. The interdigital output transducer has the identical construction and it is connected to a load 21 through a phase shifter 20. However, it is of course possible that at least one of the two transducers is of the imperfect unidirectivity. A phase shifter 16 is a Bessel type phase shifter which is connected in series with an inductor of 1.99 μH and a resistor of 105.2 Ω. The above inductance and resistance values of the inductor and resistor are set for the purpose of making the phase shifter 16 have an electrical phase difference of 120°. The center-to-center distance 17 between the interdigital sending electrode and the interdigital reflection electrode is set to 183.1 μm to provide a geometrical phase difference of 120°. Therefore, the sum of the electrical phase difference and geometrical phase difference is about 1.33 π radians. Each of the transducers is prepared by photolithographing a 6000 Å vapor deposited aluminum film and has a center frequency of 56.5 MHz.

Since the signal source conductance and load conductance are both 5 to 6 m , the aperture length of the transducer is set to 1200 μm so that the input/output conductance becomes 3.3 m . Under the conditions, the filter can be obtained, having an insertion loss of 2.7 dB and an undesired reflection wave level (triple transit echo) of −44 dB.

As has been described, according to the present invention, there is no need of making the signal source or load conductance perfectly identical with the conductance of the unidirectional input or output transducer in contrast to the prior art filter and the allowable range of noncoincidence can be extended, so that the adjustment process for the signal source or load conductance can be dispensed with. In addition, since the input or output conductance of the surface acoustic wave filter can be so decreased as to fall within the above allowable limit, the filter can be decreased in size. In the above embodiment, size reduction by about 41% can be accomplished. The loss is slightly increased as compared to that of the perfect unidirectional filter but is still considerably low as compared to that of the prior art bidirectional filter.

Thus, the present invention can increase the degree of freedom of the filter transducer design and the practical circuit design, and can materialize the adjustmentfree filter circuit and reduction of manufacturing cost, thereby providing the commercially usable filter circuit.

I claim:

1. A surface acoustic wave filter comprising:
   a substance for propagating surface acoustic waves;
   at least one interdigital input transducer, formed on said substrate, which is adapted for connection to a signal source and for conversion of an electrical signal from said signal source into a surface acoustic wave;
   at least one interdigital output transducer, formed on said substrate, which is adapted for connection to a load and for conversion of said acoustic surface wave into said electric signal; and
   at least one of said interdigital input and output transducers including an interdigital sending electrode part and an interdigital reflection electrode part, said interdigital sending and reflection electrode parts being arranged to provide a geometrical phase difference $\phi_M$ radians when said acoustic surface wave travels a predetermined distance between respective centers of said sending and reflection electrode parts and interconnected through phase shifter means which provides an electrical phase difference $\phi_E$ radians therebetween, the sum $(\phi_M+\phi_E)$ of said phase differences being a value within a range from 0 to $2\pi$ radians other than a value of $\pi$ radians.

2. A surface acoustic wave filter according to claim 1 wherein when degree a defined by $$a = \frac{1 + \cos(\phi_M + \phi_E)}{1 + \cos(\phi_M - \phi_E)}$$

falls within a range $0 < a \leq 9/11$, the ratio of at least one of conductances $G_l$ of said signal source or load to a radiation conductance $G_a$ of said interdigital transducer is so set as to satisfy the following condition:

$$\frac{9(a + 1)}{11 - 9a} \leq G_l/G_a \leq \frac{11(a + 1)}{9 - 11a}.$$

3. A surface acoustic wave filter according to claim 1 wherein when degree a defined by $$a = \frac{1 + \cos(\phi_M + \phi_E)}{1 + \cos(\phi_M - \phi_E)}$$

falls within a range $9/11 \leq a \leq 1$, the ratio of at least one of conductances $G_l$ of said signal source or load to a radiation conductance $G_a$ of said interdigital transducer is so set as to satisfy the following condition:

$$\frac{9(a + 1)}{11 - 9a} \leq G_l/G_a.$$

4. A surface acoustic wave filter comprising:
   a substrate for propagating surface acoustic waves;
   at least one interdigital input transudcer, formed on said substrate, which is adapted for connection to a signal source and for conversion of an electrical signal from said signal source into a surface acoustic wave;

at least one interdigital output transducer, formed on said substrate, which is adapted for connection to a load and for conversion of said acoustic surface wave into said electric signal; and at least one of said interdigital input and output transducers including an interdigital sending electrode part and an interdigital reflection electrode part, said interdigial sending and reflection electrode parts being arranged to provide a geometrical phase difference $\phi_M$ radians therebetween and interconnected through phase shifter means which provides an electrical phase difference $\phi_E$ radians therebetween, wherein when degree a defined by $$a = \frac{1 + \cos(\phi_M + \phi_E)}{1 + \cos(\phi_M - \phi_E)}$$

falls within a range $0 < a \leq 9/11$, the ratio of at least one of conductances $G_l$ of said signal source or load to a radiation conductance $G_a$ of said interdigital transducer is so set as to satisfy the following condition:

$$\frac{9(a + 1)}{11 - 9a} \leq G_l/G_a \leq \frac{11(a + 1)}{9 - 11a}.$$

5. A surface acoustic wave filter comprising:
a substrate for propagating surface acoustic waves;
at least one interdigital input transducer, formed on said substrate, which is adapted for connection to a signal source and for conversion of an electrical signal from said signal source into a surface acoustic wave;

at least one interdigital output transducer, formed on said substrate, which is adapted for connection to a load and for conversion of said acoustic surface wave into said electric signal; and at least one of said interdigital input and output transducers including an interdigital sending electrode part and an interdigital reflection electrode part, said interdigital sending and reflection electrode parts being arranged to provide a geometrical phase difference $\phi_M$ radians therebetween and interconnected through phase shifter means which provides an electrical phase difference $\phi_E$ radians therebetween, wherein when degree a defined by $$a = \frac{1 + \cos(\phi_M + \phi_E)}{1 + \cos(\phi_M - \phi_E)}$$

falls within a range $9/11 \leq a \leq 1$, the ratio of at least one of conductances $G_l$ of said signal source or load to a radiation conductance $G_a$ of said interdigital transducer is so set as to satisfy the following condition:

$$\frac{9(a + 1)}{11 - 9a} \leq G_l/G_a.$$

* * * * *